United States Patent
Varadi et al.

(10) Patent No.: US 10,417,596 B2
(45) Date of Patent: Sep. 17, 2019

(54) POINT-BASED RISK SCORE FOR MANAGING ENVIRONMENTAL SYSTEMS

(71) Applicant: Vigilent Corporation, Oakland, CA (US)

(72) Inventors: Peter C. Varadi, El Cerrito, CA (US); Willem Maas, Napa, CA (US); Clifford C. Federspiel, El Cerrito, CA (US)

(73) Assignee: Vigilent Corporation, El Cerrito, CA (US)

( * ) Notice: Subject to any disclaimer, the term of this patent is extended or adjusted under 35 U.S.C. 154(b) by 0 days.

(21) Appl. No.: 15/340,635

(22) Filed: Nov. 1, 2016

(65) Prior Publication Data
US 2017/0046640 A1    Feb. 16, 2017

Related U.S. Application Data

(63) Continuation of application No. PCT/US2015/029266, filed on May 5, 2015.
(Continued)

(51) Int. Cl.
*G06F 1/20* (2006.01)
*F24F 11/30* (2018.01)
(Continued)

(52) U.S. Cl.
CPC .......... *G06Q 10/0635* (2013.01); *F24F 11/30* (2018.01); *F24F 11/62* (2018.01);
(Continued)

(58) Field of Classification Search
CPC ............. G06F 1/206; G06F 1/20; F24F 11/30
(Continued)

(56) References Cited

U.S. PATENT DOCUMENTS

| | | |
|---|---|---|
| 4,873,649 A | 10/1989 | Grald et al. |
| 5,170,935 A | 12/1992 | Federspiel et al. |

(Continued)

FOREIGN PATENT DOCUMENTS

| | | |
|---|---|---|
| EP | 0501432 | 9/1994 |
| JP | 54-016081 A | 2/1979 |

(Continued)

OTHER PUBLICATIONS

Written Opinion dated Feb. 14, 2013 in 'Singaporean Patent Application No. 201201144-1, 10 pages.

*Primary Examiner* — Johnna R Loftis
(74) *Attorney, Agent, or Firm* — Kilpatrick Townsend & Stockton, LLP

(57) ABSTRACT

Methods are provided for calculating a reserve value or a risk value for various locations in an environmentally-controlled space such as a data center, and using the reserve value or risk value to allocate environmental maintenance modules and/or load. For example, an influence model can predict a change in a sensor value at a location for a corresponding change in an operation level of an actuator of one of the environmental maintenance modules. Based on the influence model and an operation level of the actuator, a reserve value can be determined for the location. A risk value for the location can be determined using a risk metric that may use the reserve value, a current sensor value at the location, and a threshold sensor value at the location.

21 Claims, 10 Drawing Sheets

Related U.S. Application Data

(60) Provisional application No. 61/988,791, filed on May 5, 2014.

(51) Int. Cl.
| | | |
|---|---|---|
| *G06F 9/50* | (2006.01) | |
| *G06Q 10/06* | (2012.01) | |
| *F24F 11/62* | (2018.01) | |
| *H05K 7/14* | (2006.01) | |
| *H05K 7/20* | (2006.01) | |
| *F24F 11/63* | (2018.01) | |
| *F24F 110/20* | (2018.01) | |
| *F24F 110/10* | (2018.01) | |
| *G06F 1/3206* | (2019.01) | |

(52) U.S. Cl.
CPC ....... *H05K 7/1498* (2013.01); *H05K 7/20836* (2013.01); *F24F 11/63* (2018.01); *F24F 2110/10* (2018.01); *F24F 2110/20* (2018.01); *G06F 1/20* (2013.01); *G06F 1/206* (2013.01); *G06F 1/3206* (2013.01); *G06F 9/5094* (2013.01)

(58) Field of Classification Search
USPC ......................................................... 705/7.28
See application file for complete search history.

(56) References Cited

U.S. PATENT DOCUMENTS

| | | |
|---|---|---|
| 5,233,540 A | 8/1993 | Andersson |
| 5,303,080 A | 4/1994 | O'Brien |
| 5,464,369 A | 11/1995 | Federspiel |
| 5,550,752 A | 8/1996 | Federspiel |
| 5,610,843 A | 3/1997 | Chou |
| 5,768,121 A | 6/1998 | Federspiel |
| 5,862,982 A | 1/1999 | Federspiel |
| 5,875,109 A | 2/1999 | Federspiel |
| 5,920,478 A | 7/1999 | Ekblad et al. |
| 6,101,459 A | 8/2000 | Tavallaei et al. |
| 6,402,043 B1 | 6/2002 | Cockerill |
| 6,470,230 B1 | 10/2002 | Toprac et al. |
| 6,557,574 B2 | 5/2003 | Federspiel |
| 6,719,625 B2 | 4/2004 | Federspiel |
| 6,865,449 B2 | 3/2005 | Dudley |
| 7,058,477 B1 | 6/2006 | Rosen |
| 7,089,087 B2 | 8/2006 | Dudley |
| 7,097,111 B2 | 8/2006 | Riley et al. |
| 7,117,129 B1 | 10/2006 | Bash et al. |
| 7,363,094 B2 | 4/2008 | Kumar |
| 7,664,573 B2 | 2/2010 | Ahmed |
| 7,676,280 B1 | 3/2010 | Bash et al. |
| 7,839,275 B2 | 11/2010 | Spalink et al. |
| 7,847,681 B2 | 12/2010 | Singhal et al. |
| 7,890,215 B2 | 2/2011 | Duncan |
| 7,894,943 B2 | 2/2011 | Sloup et al. |
| 8,126,574 B2 | 2/2012 | Discenzo et al. |
| 8,224,489 B2 | 7/2012 | Federspiel |
| 8,255,085 B2 | 8/2012 | Salsbury |
| 8,260,928 B2* | 9/2012 | Pienta ..................... G06F 1/206 455/450 |
| 8,374,731 B1 | 2/2013 | Sullivan |
| 8,684,802 B1* | 4/2014 | Gross ..................... G06F 1/206 361/695 |
| 8,694,279 B1* | 4/2014 | Stiver ................. H05K 7/20836 165/104.33 |
| 8,924,026 B2 | 12/2014 | Federspiel et al. |
| 9,448,544 B2* | 9/2016 | Slessman ............... G05B 13/02 |
| 9,582,009 B2* | 2/2017 | Shahapurkar ........ F24F 11/0009 |
| 9,595,070 B2* | 3/2017 | Matsuoka .............. G06Q 50/06 |
| 2002/0020446 A1 | 2/2002 | Federspiel |
| 2003/0064676 A1 | 4/2003 | Federspiel |
| 2003/0067745 A1 | 4/2003 | Patel et al. |
| 2003/0200050 A1 | 10/2003 | Sharma |
| 2004/0065097 A1 | 4/2004 | Bash et al. |
| 2005/0096789 A1 | 5/2005 | Sharma et al. |
| 2006/0116067 A1 | 6/2006 | Federspiel |
| 2006/0161307 A1* | 7/2006 | Patel ..................... F24F 11/0086 700/277 |
| 2006/0206291 A1 | 9/2006 | Bash et al. |
| 2006/0234621 A1 | 10/2006 | Desrochers et al. |
| 2007/0038414 A1 | 2/2007 | Rasmussen et al. |
| 2007/0089446 A1 | 4/2007 | Larson et al. |
| 2007/0255446 A1 | 11/2007 | Backstrom |
| 2008/0183060 A1 | 7/2008 | Steil |
| 2009/0204267 A1 | 8/2009 | Sustaeta et al. |
| 2009/0271150 A1 | 10/2009 | Stluka et al. |
| 2011/0106314 A1 | 5/2011 | Beitelmal |
| 2011/0161059 A1 | 6/2011 | Jain et al. |
| 2011/0173465 A1* | 7/2011 | Akers ................... G06F 1/3206 713/310 |
| 2011/0203785 A1 | 8/2011 | Federspiel |
| 2012/0101648 A1* | 4/2012 | Federspiel ......... G05D 23/1934 700/291 |
| 2013/0006429 A1 | 1/2013 | Shanmugam et al. |
| 2014/0337256 A1* | 11/2014 | Varadi ................... G05B 13/04 706/12 |

FOREIGN PATENT DOCUMENTS

| | | |
|---|---|---|
| JP | 05-231693 | 9/1993 |
| JP | 06-323595 | 11/1994 |
| JP | 2001227797 A | 10/2004 |
| JP | 2004293844 A | 10/2004 |
| JP | 2007206060 A | 8/2007 |
| JP | 2010523167 A | 7/2010 |
| JP | 2010181082 A | 8/2010 |
| JP | 2013511694 A | 4/2013 |
| JP | 2013516670 A | 5/2013 |
| WO | 95/01592 | 1/1995 |
| WO | 2006/099337 | 9/2006 |
| WO | 2011062942 A1 | 5/2011 |

* cited by examiner

POINT-BASED RISK SCORE FOR MANAGING ENVIRONMENTAL SYSTEMS

CROSS-REFERENCES TO RELATED APPLICATIONS

The present application is a continuation of PCT application No. PCT/US2015/029266, filed May 5, 2015, which claims priority to U.S. Provisional Application No. 61/988,791, filed on May 5, 2014, the entire contents of which are herein incorporated by reference for all purposes.

BACKGROUND

Many modern datacenters use environmental maintenance systems including heating, ventilation, and air conditioning (HVAC) units to control indoor temperature, humidity, and other variables. It is common to have many HVAC units deployed throughout a data center. They are often floor-standing units, but may be wall-mounted, rack-mounted, or ceiling-mounted. The HVAC units often provide cooled air to a raised floor plenum, to a network of air ducts, or to the open air of the data center. The data center itself, or a large section of a large data center, typically has an open-plan construction (i.e., no permanent partitions separating air in one part of the data center from air in another part). Thus, in many cases, these data centers have a common space that is temperature-controlled and humidity controlled by multiple HVAC units.

HVAC units for data centers are typically operated with decentralized, stand-alone controls. It is common for each unit to operate in an attempt to control the temperature and humidity of the air entering the unit from the data center. For example, an HVAC unit may include a sensor that determines the temperature and humidity of the air entering the unit to align with set points for that unit.

For reliability, most data centers are designed with an excess number and capacity of HVAC units. Since the open-plan construction allows free flow of air throughout the data center, the operation of one unit can be coupled to the operation of another unit. The excess units and capacity, and the fact that they deliver air to substantially overlapping areas provides a redundancy, which ensures that if a single unit fails, the data center equipment (servers, routers, etc.) will still have adequate cooling.

However, the level of redundancy is rarely uniformly distributed across a data center. For example, some areas of a data center may have a higher amount of heating load, because there are more servers in those areas of the data center, the servers generate more heat (e.g., because they are often run at high utilization), or some combination thereof. In addition, some areas of a data center may have less effective cooling (e.g., because there are fewer or lower capacity HVAC units nearby). If the reliability of a data center is treated atomically, this may lead to over-representing risk and increasing cooling equipment and energy costs, or under-representing risk and introducing the possibility of a catastrophic failure.

Therefore, it is desirable to provide methods and systems that can quantitatively represent the level of reserve and risk at various locations in a data center or another environmentally controlled space.

BRIEF SUMMARY

Embodiments of the invention generally relate to calculating a reserve value or a risk value for various locations in an environmentally-controlled space such as a data center, and using the reserve value or risk value to allocate environmental maintenance modules and/or load.

For example, historical and other data can be used to determine an influence model for each of one or more environmental maintenance modules, such as HVAC units, in an environmental maintenance system. An influence model can predict a change in a sensor value at a location for a corresponding change in an operation level of an actuator of one of the environmental maintenance modules. Based on the influence model and an operation level of the actuator, a reserve value can be determined for the location. A risk value for the location can be determined using a risk metric that may use the reserve value, a current sensor value at the location, and a threshold sensor value at the location.

Some embodiments can use a reserve metric and/or a risk metric to allocate environmental maintenance modules. For example, a new environmental maintenance module can be placed at a location with a low reserve value and/or a high risk value.

Some embodiments can use a reserve metric and/or a risk metric to allocate load. For example, in a data center, computational load can be allocated to a location with a high reserve value and/or a low risk value.

Other embodiments are directed to systems, portable consumer devices, and computer readable media associated with methods described herein.

A better understanding of the nature and advantages of embodiments of the present invention may be gained with reference to the following detailed description and the accompanying drawings.

TERMS

Figure 1:
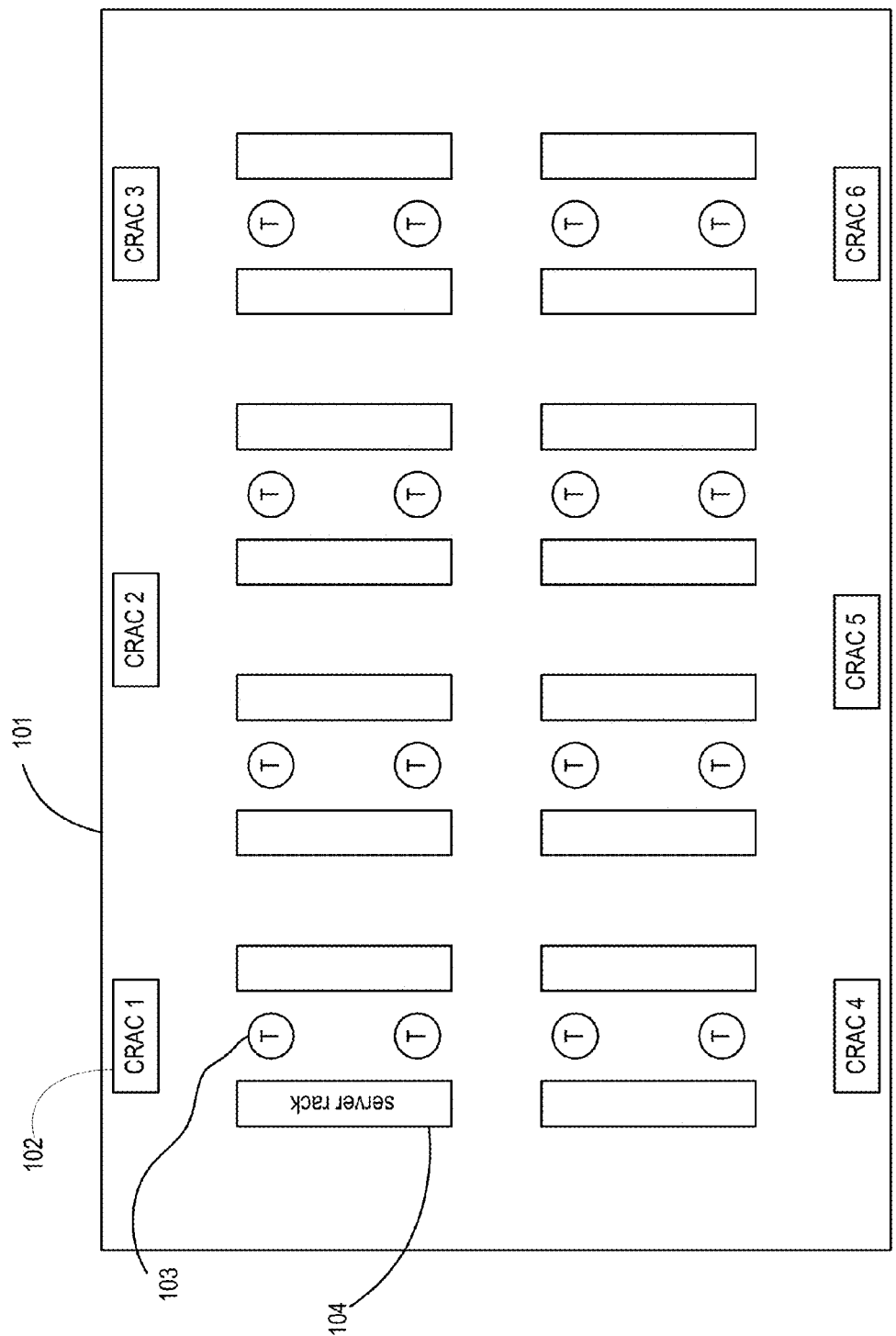
FIG. 1 shows a plan view of a data center conditioned by HVAC units.

An "environmental maintenance system" may include any system for controlling the environment of a space (an "environmentally-controlled space"). Environmental maintenance systems can include one or more "environmental maintenance modules" such as heating, ventilation, and air conditioning (HVAC) units, computer room air conditioner (CRAC) units, etc. Each of the environmental maintenance modules can include zero, one, or more actuators. In addition, the environmental maintenance system may include one or more sensors.

An "actuator" may include any device or process that controls the operation of an environmental maintenance module. An actuator may function mechanically, electrically, electronically, programmatically, or in any other suitable manner. Examples of actuators may include fan speed controllers, heating controllers, etc.

An "operation level" may include any number, percentage, or other quantity that measures the operation of an actuator. For example, if an actuator is a fan speed controller, a corresponding operation level may be a number of revolutions per minute (RPM) of the fan, a percentage of the fan's maximum RPM, or any other suitable quantity. A "current operation level" may refer to an operation level of an actuator at a specific time.

An "operation threshold value" may include any number, percentage, or other quantity that measures a threshold for an operation level. For example, the operation threshold value may measure a maximum and/or minimum operation level for an actuator. In the case of a fan, a maximum operation threshold value may be the maximum RPM of the fan, or 100% (if the operation level is a percentage). Similarly, the minimum operation threshold value may be 0 RPM, or the slowest speed at which the fan can be driven.

A "sensor" may include any device that measures a quantity at a location. For example, a sensor may be a thermometer, a hygrometer, a barometer, etc. In some cases, a sensor may be a part of an environmental maintenance module. In other cases, a sensor may be standalone; for example, it may not be associated with an environmental maintenance module.

A "sensor value" may include any measurement or other value of a physical condition of a location determined from a sensor. For example, if a sensor is a thermometer, the sensor value may be a temperature measured by the thermometer. Similarly, if the sensor is a hygrometer, the sensor value may be a humidity measured by the hygrometer.

A "sensor threshold value" may include any sensor value beyond which is undesirable. For example, a sensor value below a minimum sensor threshold value may be undesirable, and a sensor value above a maximum sensor threshold value may similarly be undesirable. In the case of a thermometer in a data center, for example, a maximum sensor threshold value may be a value above which overheating of a server is likely. A minimum sensor threshold value may be a value below which condensation is likely to form on a server.

An "influence function" or "influence model" may include any function, formula, model, or other method for predicting the extent to which an actuator's operation level affects a sensor value. For example, if an actuator is a fan speed controller, and a sensor is a thermometer, an influence function may indicate a temperature decrease that can be achieved as a function of increasing fan speed.

Typically, an influence function is specific to a location (i.e., the location of the sensor); the same actuator may be associated with different influence functions at different locations in an environmentally-controlled space. For instance, the influence function for a fan speed controller may be significantly different at a location several meters from the fan when compared to a location directly adjacent to the fan.

A "reserve metric" may include any metric that can be used to quantify a level of operational reserve associated with a location in an environmentally-controlled space. Typically, a reserve metric is chosen to quantify the extent to which operation levels of actuators can be altered to change a sensor value at the location. For example, a reserve metric may measure a temperature decrease at a location if all environmental maintenance modules in an environmentally-controlled space were to be run at full capacity. A "reserve value" may include the value of a reserve metric at a location.

A "risk metric" may include any metric that can be used to quantify a level of operational risk associated with a location in an environmentally-controlled space. Typically, a risk metric can take into account the capability of environmental maintenance modules to influence a sensor value at a location, a current sensor value at the location, and a sensor threshold value at the location. In some cases, a risk metric may take into account a reserve value at the location. For example, a risk metric may measure a temperature difference between a maximum acceptable temperature at a location and a current temperature at the location, and subtract a reserve value at the location.

DETAILED DESCRIPTION

Embodiments of the invention generally relate to calculating a reserve value or a risk value for various locations in an environmentally-controlled space such as a data center, and using the reserve value or risk value to allocate environmental maintenance modules and/or load.

For example, historical and other data can be used to determine an influence model for each of one or more environmental maintenance modules, such as HVAC units, in an environmental maintenance system. An influence model can predict a change in a sensor value at a location for a corresponding change in an operation level of an actuator of one of the environmental maintenance modules. Based on the influence model and an operation level of the actuator a reserve value can be determined for the location. A risk value for the location can be determined using a risk metric that may use the reserve value, a current sensor value at the location, and a threshold sensor value at the location.

Some embodiments can use a reserve metric and/or a risk metric to allocate environmental maintenance modules. For example, a new environmental maintenance module can be placed at a location with a low reserve value and/or a high risk value. This allows the modules to be targeted to where they can have the most impact on reducing the likelihood of catastrophic environmental conditions. Reserve and risk metrics in accordance with embodiments are especially preferable to other metrics such as average sensor values (e.g., temperature) over time, since reserve and risk can take into account the unused capacity of environmental maintenance modules. Using reserve and risk values can also allow modules to be placed efficiently, preventing overbuilding and overutilization of capacity beyond what is needed. Thus, embodiments can reduce both setup and ongoing costs of an environmental maintenance system.

Some embodiments can use a reserve metric and/or a risk metric to allocate load. For example, in a data center, computational load can be allocated to a location with a high reserve value and/or a low risk value. Furthermore, allocating load based on risk and reserve is advantageous over simply allocating resources to locations with desirable current or average sensor values (e.g., temperature), because risk and reserve can take into account the remaining capacity of the environmental maintenance system to maintain environmental conditions.

The above examples highlight only a few of the advantages of calculating and using reserve values and risk values in accordance with embodiments of the inventions.

I. Example Systems

Figure 2:
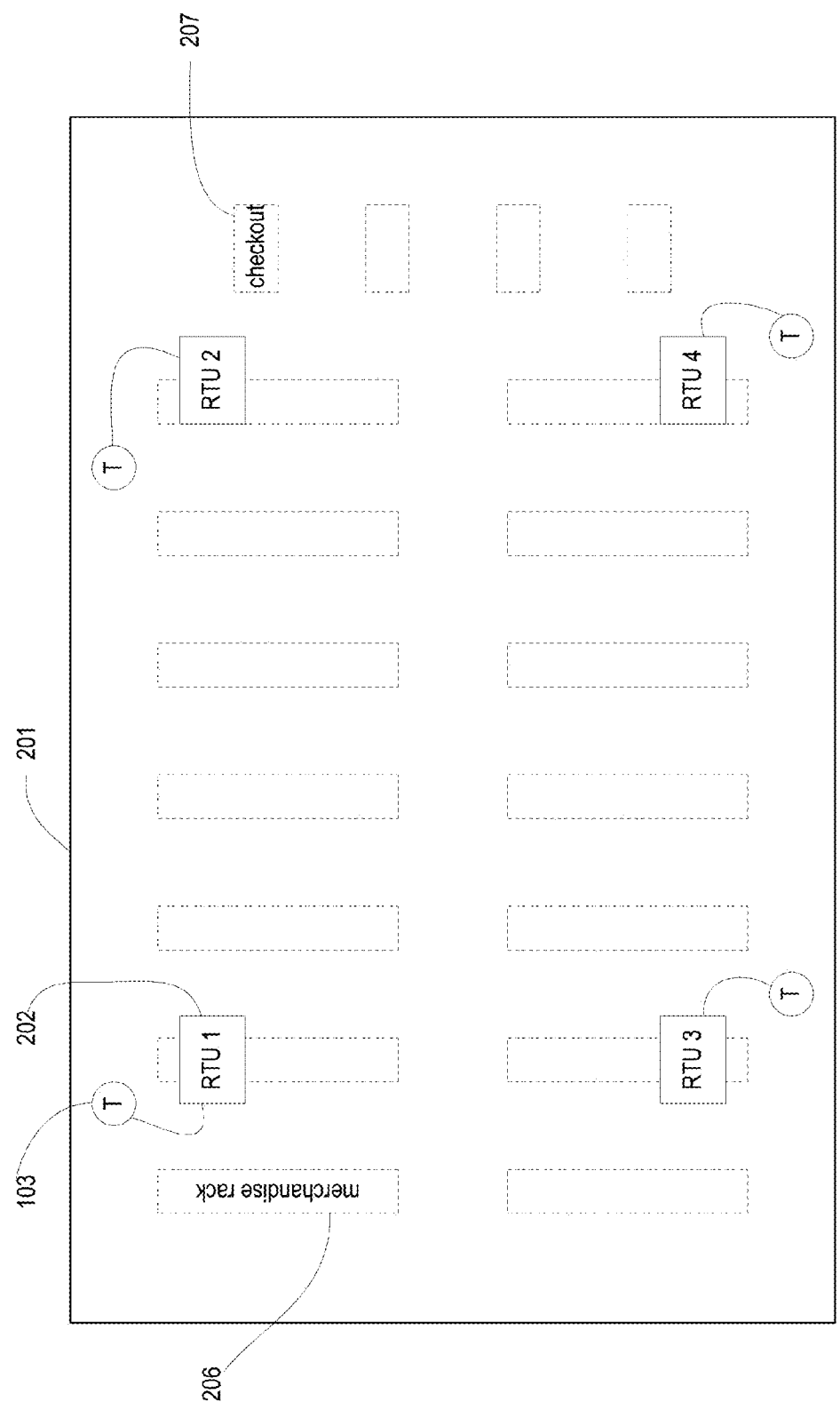
FIG. 2 shows a plan view of an open-plan building conditioned by unitary rooftop units.

Embodiments of the invention relate to environmental maintenance systems that manage conditions in an environmentally-controlled space. FIGS. 1 and 2 describe examples of environmental maintenance systems in a data center and a retail store, respectively.

A. Example Data Center

FIG. 1 shows a floor plan of a data center comprising an environmental maintenance system according to an embodiment of the present invention. Perimeter wall 101 may be a perimeter wall of an environmentally-controlled space corresponding to the data center. The data center can include a plurality of environmental maintenance modules 102, a plurality of sensors 103, and a plurality of server racks 104. As shown in FIG. 1, the environmental maintenance modules are computer room air conditioner (CRAC) units.

In one embodiment, environmental maintenance modules 102 are unitary equipment that provide airflow to the data center to cool servers in server racks 104. In one aspect, environmental maintenance modules 102 can cool, heat, humidify, or dehumidify air that passes through them. Sensors 103 are devices that measure environmental parameters, such as temperature or humidity. Sensors 103 can transmit measurements (also called values) by any means, such as by wired or wireless communication means (e.g., Modbus, BACnet, Wi-Fi, WiMAX, ZigBee, or any other applicable protocol). Each environmental maintenance module 102 can include zero, one, or more actuators that change the operation of the environmental maintenance module. The actuators can be controlled by a computer system with one or more processors to provide specified conditions within the data center.

B. Example Retail Store

FIG. 2 shows a floor plan of a retail store comprising an environmental maintenance system according to an embodiment of the present invention. In this example, Perimeter wall 201 may be a perimeter wall of an environmentally-controlled space corresponding to the building of the retail store, or may be a space within the store. The environmental maintenance modules 202 shown in FIG. 2 are roof top units (RTU). As depicted, a wired communication can occur between the environmental maintenance modules 102 and sensors (T) 103 near that particular RTU, but wireless communications may also be used. The environmentally-controlled space can also include merchandise racks 206 and a store checkout counter 207.

C. Example Computer Room Air Handling Unit

Figure 3:
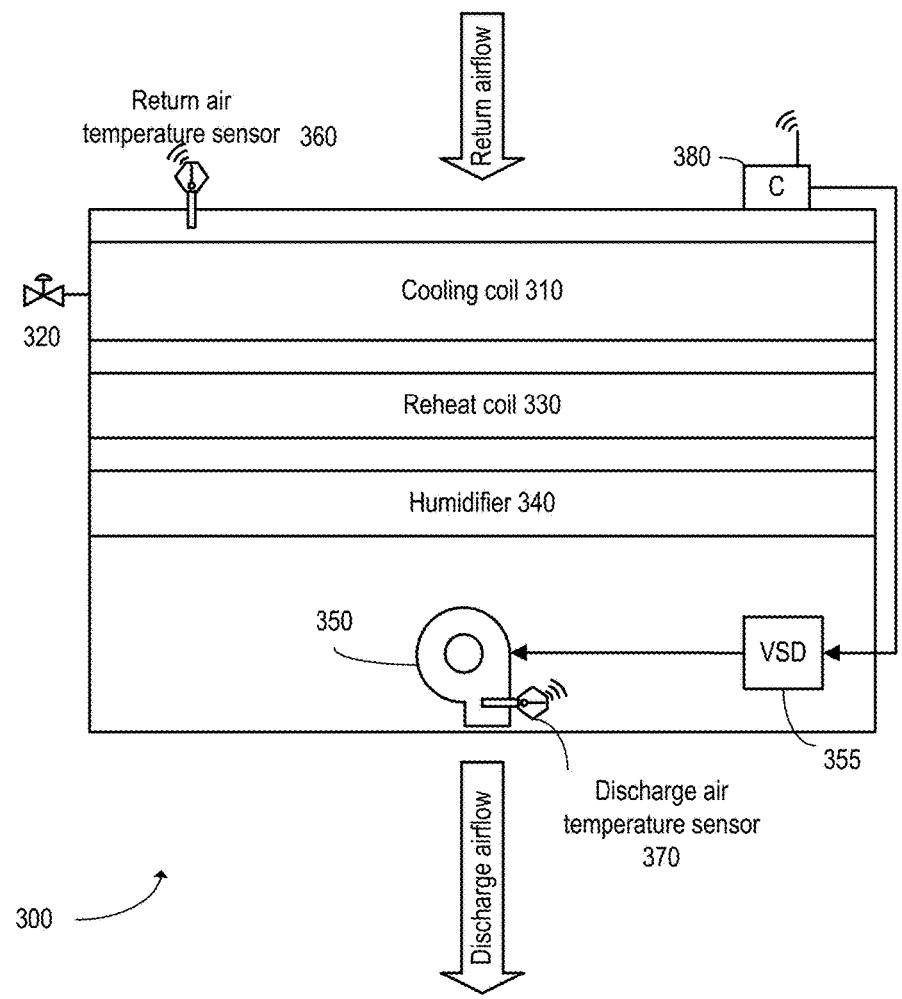
FIG. 3 shows a schematic diagram of a computer room air handling unit.

FIG. 3 is a schematic diagram of a computer room air handling unit 300 according to an embodiment of the present invention. Computer room air handling unit 300 is an example of an environmental maintenance module. As shown, computer room air handling unit 300 has a cooling coil 310, which may contain chilled water modulated by a chilled water valve 320. The computer room air handling unit 300 also has a reheat coil 330 (e.g. an electric coil) and a humidifier 340 (e.g., an infrared humidifier).

In one embodiment, fan 350 is a centrifugal fan driven by an A/C induction motor. The induction motor may have a variable speed (frequency) drive VSD 355 for changing its speed. A wireless sensor 360 measures return air temperature, a wireless sensor 370 measures discharge air temperature, and a wireless control 380 to control the VSD 355. In some embodiments, the VSD 355 and/or the wireless control 380 can be included in an actuator that controls fan 350. The discharge air temperature sensor 370 and return air temperature sensors 360 may be probes tethered to the wireless control 380 rather than separate wireless sensors.

In one embodiment of operation, the wireless sensors 360 and 370 send readings over the radio to a wireless network gateway, which passes the signals to a control computer of an environmental maintenance system. The control computer can send actuation commands to the wireless gateway, which relays the commands to the wireless control 380, which changes the operation level (e.g., speed) of the variable speed drive 355.

II. Maintaining Temperature

It is often useful to measure the performance of an environmental maintenance system. For example, it may be important to ensure that conditions (e.g., temperature) in the corresponding environmentally-controlled space always remain within sensor threshold values (e.g., a minimum and maximum temperature).

A. Temperature Time Series

Figure 4:
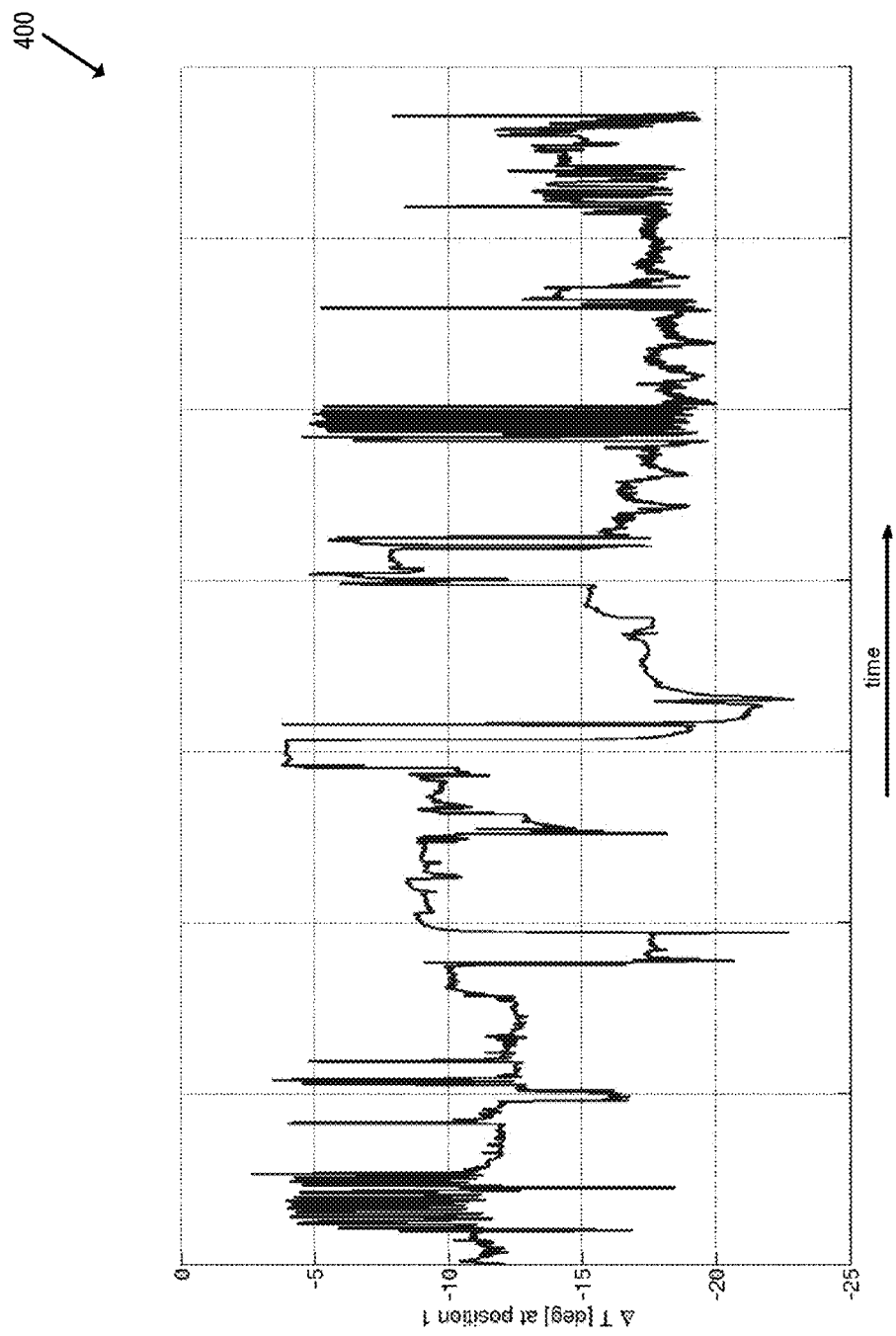
FIG. 4 shows a graph of a temperature time series measured at a location in an example data center.

FIG. 4 shows a graph 400 of a temperature time series measured by a sensor at a location 1 in a data center over a selected period of time. More precisely, graph 400 shows the difference, DeltaT, between the measured temperature value and a maximum temperature threshold value. The threshold value may have been selected for different reasons, for example for triggering a high temperature alarm, or as an indicator of elevated risk to IT equipment, or any other suitable reason.

In this example, the graph 400 indicates that location 1 had large temperature variations in the past but stayed well below the temperature threshold all the time. Without context, i.e., without comparing this information to that at other locations and to other environmental data, it can be difficult, if not impossible, for a data center operator to assess if location 1 is a good place to add additional IT load. The time series in the example expresses little more than "it was cold most of the time."

A graph like graph 400 is a good tool for an operator to quickly assess the current and past environmental conditions (not limited to temperature) at one or few locations. However, due to crowding, time series graphs lose their usefulness if too many time series are shown together in one graph.

B. Temperature Box Plots

Figure 5:
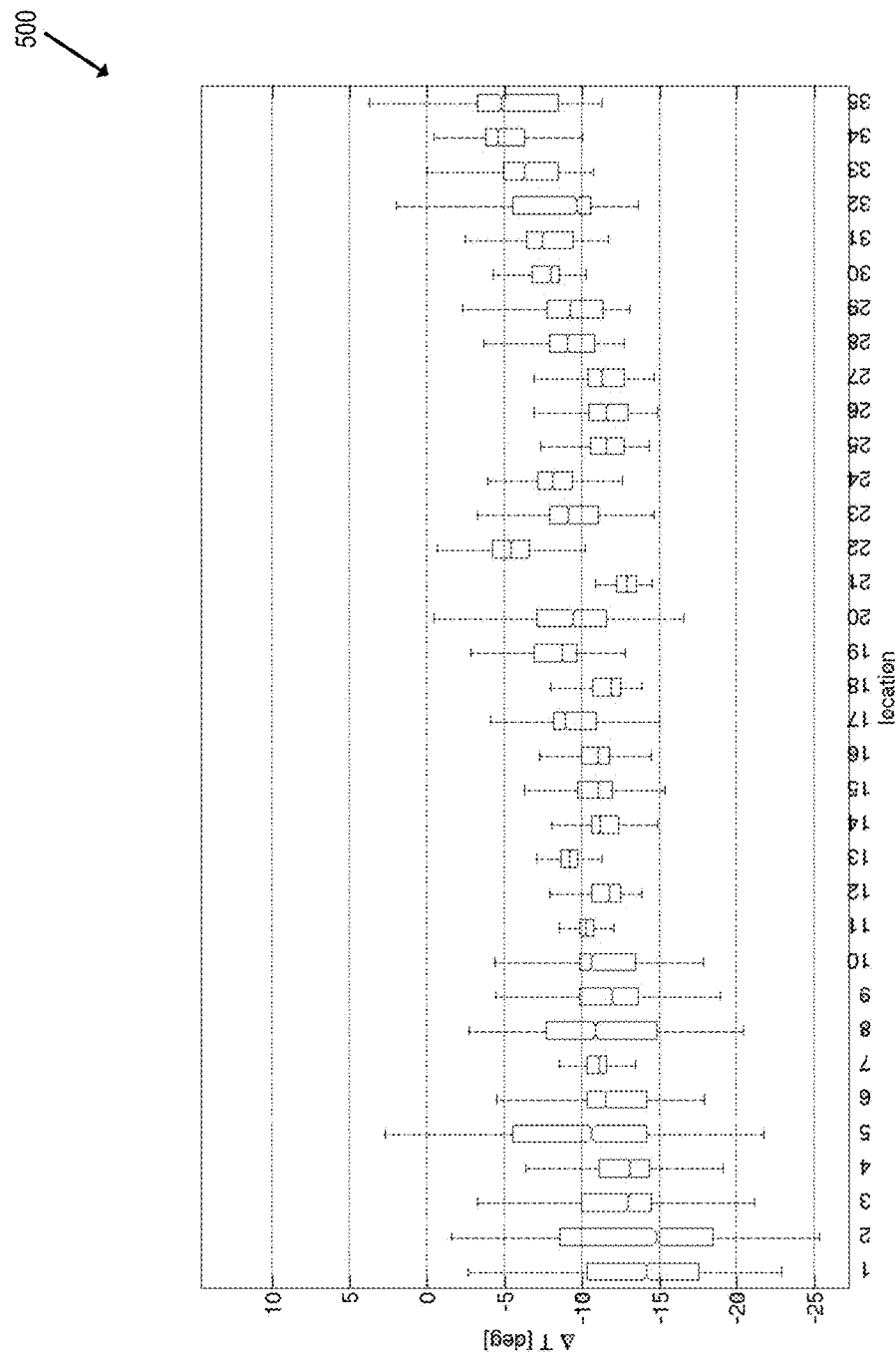
FIG. 5 shows a graph of box plots summarizing temperature time series measured at a plurality of locations in the example data center.

FIG. 5 shows a graph 500 including box plots of the DeltaT time series of all environmentally monitored location in the data center. A box plot is a visualization of summary statistics of a set of data. In this case, each box spans the second and third quartiles of the associated time series data. The attached vertical 'whiskers' indicate the total range of data in the associated time series. The line at the notch in each box indicates the median of the associated time series data.

Each box represents one location in the data center. The boxes are spread out horizontally in the graph and an associated location label is listed below each box. The horizontal ordering of the boxes can be changed to better express a sorting or ranking. For example, the boxes could be sorted by any one of the features of a box plot to express different views and needs of a user. Alternatively, the boxes could be ordered by the endpoint of the upper whisker in decreasing order, or by the lower edge of the box, or by any other features.

Other types of environmental time series data can be compared in the same manner, including operational data of cooling equipment. For example, cooling equipment cooling capacity time series and associated box plots can help to compare equipment usage over time.

A graph such as graph 500 allows a data center operator to better assess a location. For example, it is clear that location 1 is variable in temperature compared to most other locations but is also mostly much colder than most. In this example, a data center operator could be inclined to think of location 1 as a comparably (environmentally) safe location.

However, relying on temperature alone may not always be advantageous, at least because the temperature at a location over time does not indicate whether the environmental maintenance system is significantly underutilized or overburdened when maintaining the measured temperature. An overburdened system can lead to situations where a small change in heating load can cause significant swings in temperature, and even catastrophic overheating. An underutilized system can lead to increased costs due to unnecessary infrastructure and energy expenditures.

Embodiments can address these issues by providing methods for calculating and using reserve and risk values for various locations in an environmentally-controlled space.

III. Reserve and Risk Utilization Methods

Figure 6:
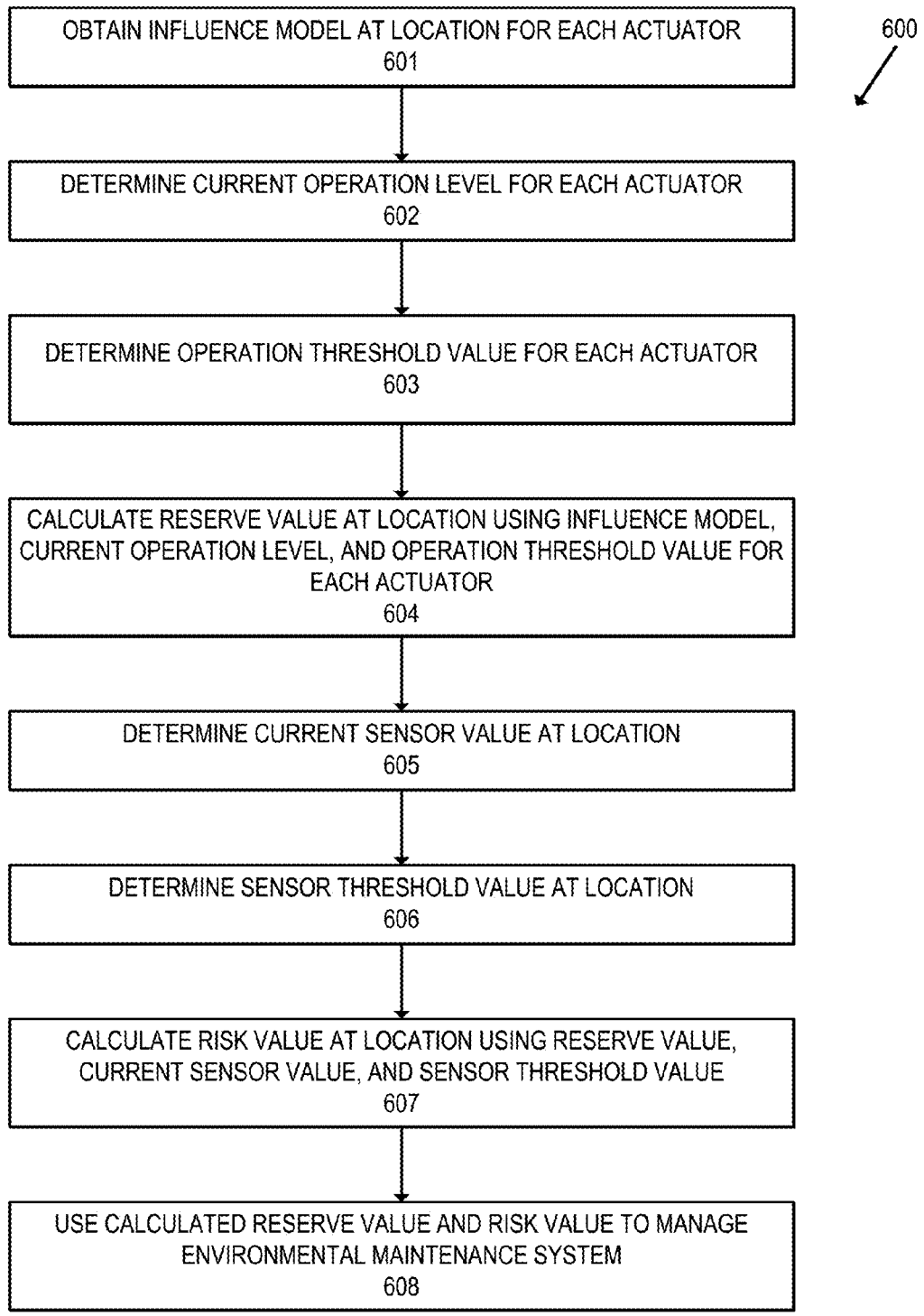
FIG. 6 shows a method for allocating IT load using a risk score calculated for a location according to embodiments of the present invention.

FIG. 6 shows a method 600 for managing an environmental maintenance system using reserve and risk values calculated for locations in an environmentally-controlled space.

At step 601, an influence model for each actuator of one or more environmental maintenance models in the environmental maintenance system is obtained. The influence model, which may also be referred to as a influence function, transfer function, transfer matrix, may indicate the extent to which changing an operation level of an environmental maintenance module's actuator affects a sensor value at the location. For example, if an actuator is a fan speed controller, and a sensor is a thermometer, an influence model may indicate a temperature decrease that can be achieved as a function of increasing fan speed.

The influence model for an actuator may be determined in any suitable manner. For example, in some embodiments, an influence function can be derived from historical data, such as operation levels and sensor values measured in an environmentally-controlled space over time. For example, a regression analysis can be performed to determine a function that correlates the operation level of an actuator to a sensor value at a location. In some embodiments, an influence function can be derived from experimental data. For example, sensor values at a location may be measured while the operation level of a single actuator is varied (and all other actuator operation levels remain fixed). A regression analysis may again be performed to determine an influence function. In some embodiments, a combination of experimental, historical, and/or other data may be used to determine an influence model.

At step 602, a current operation level for each actuator is determined. A current operation level may include any number, percentage, or other quantity that measures the operation of an actuator at a specific time. For example, if an actuator is a fan speed controller, a corresponding operation level may be a number of revolutions per minute (RPM) of the fan, a percentage of the fan's maximum RPM, or any other suitable quantity.

At step 603, an operation threshold value for each actuator is determined. An operation threshold value may include any number, percentage, or other quantity that measures a threshold for an operation level. For example, the operation threshold value may measure a maximum and/or minimum operation level for an actuator. In the case of a fan, a maximum operation threshold value may be the maximum RPM of the fan, or 100% (if the operation level is a percentage). Similarly, the minimum operation threshold value may be 0 RPM, or the slowest speed at which the fan can be driven.

At step 604, a value of a reserve value at the location is calculated using a reserve metric. A reserve metric may include any metric that can be used to quantify a level of operational reserve associated with a location in an environmentally-controlled space. Typically, a reserve metric is chosen to quantify the extent to which operation levels of actuators can be altered to change a sensor value at the location.

In some embodiments, the reserve metric can use the current operation level of an actuator, the operation threshold value of the actuator, and the influence model of the actuator. For example, in the case of a data center, a reserve metric may measure a temperature decrease at a location if all environmental maintenance modules in an environmentally-controlled space were to be run at full capacity. Further discussion of reserve metrics may be found in subsection A.

Figure 7:
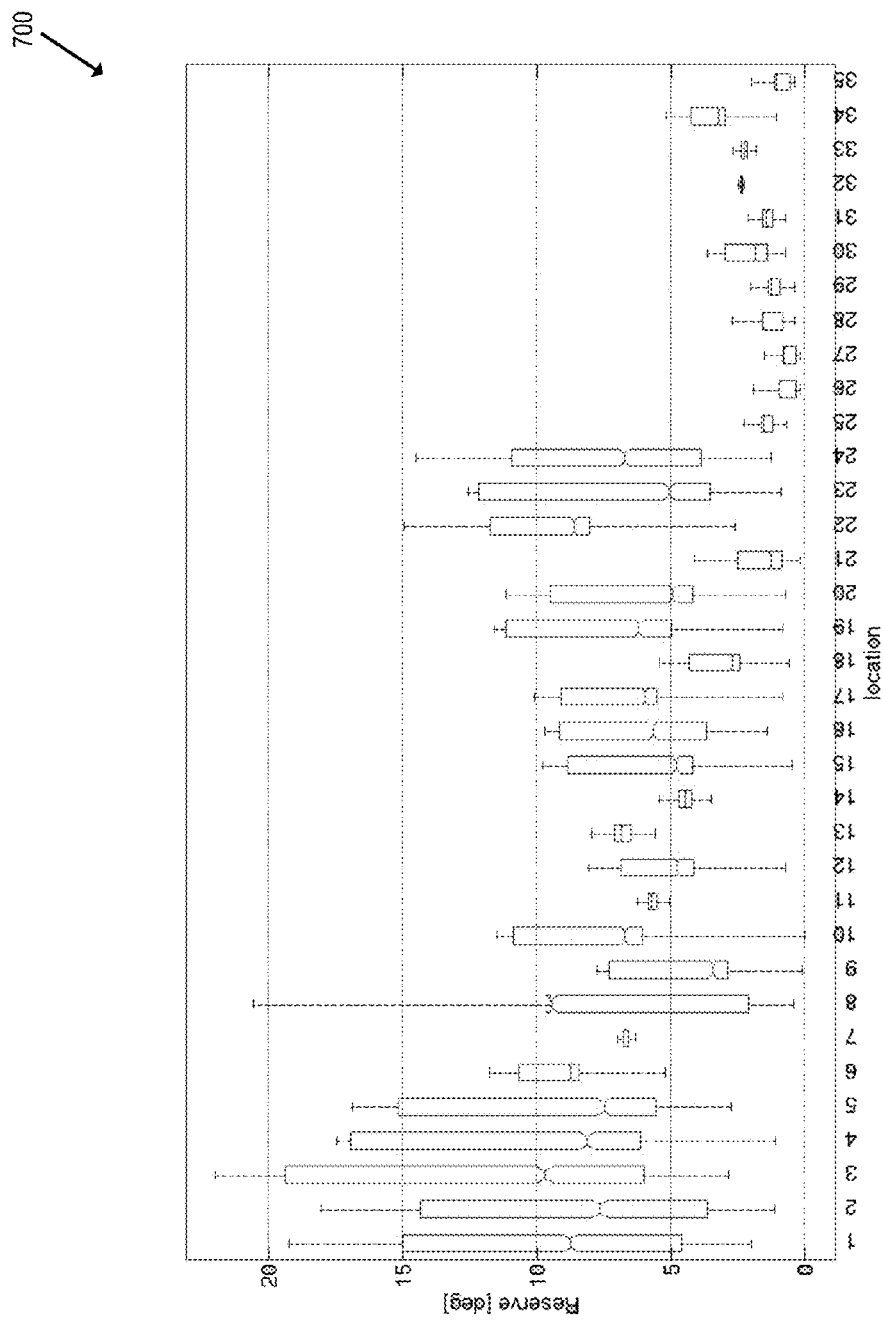
FIG. 7 shows a graph of box plots illustrating reserve metric time series measured at a plurality of locations in the example data center.

The reserve metric is a time series that is derived, in part, from other time series. As such it can be plotted or summarized in the same way, for example by a box plot, as is shown in FIG. 7.

At step 605, a current sensor value at the location is determined. A sensor value may include any measurement or other value determined from a sensor. For example, if a sensor is a thermometer, the sensor value may be a temperature measured by the thermometer. Similarly, if the sensor is a hygrometer, the sensor value may be a humidity measured by the hygrometer.

At step 606, a sensor threshold value at the location is determined. A sensor threshold value may include any sensor value beyond which is undesirable. For example, a sensor value below a minimum sensor threshold value may be undesirable, and a sensor value above a maximum sensor threshold value may similarly be undesirable. In the case of a thermometer in a data center, for example, a maximum sensor threshold value may be a value above which overheating of a server is likely. A minimum sensor threshold value may be a value below which condensation is likely to form on a server.

At step 607, a risk value is calculated for the location. The risk metric used to calculate the risk value may include any metric that can be used to quantify a level of operational risk associated with a location in an environmentally-controlled space. Typically, a risk metric can take into account the capability of environmental maintenance modules to influence a sensor value at a location, a current sensor value at the location, and a sensor threshold value at the location. In some cases, a risk metric may take into account a reserve value at the location. For example, a risk metric may measure a temperature difference between a maximum acceptable temperature at a location and a current temperature at the location, and subtract a reserve value at the location.

In some embodiments, the risk metric can combine: (1) the current state of the data center; (2) modeling information by way of predictions, e.g., using a reserve metric; and (3) configuration data, specifically predetermined temperature threshold determined at step 606 to trigger alarms, cause concerns, or do damage to IT equipment.

Figure 8:
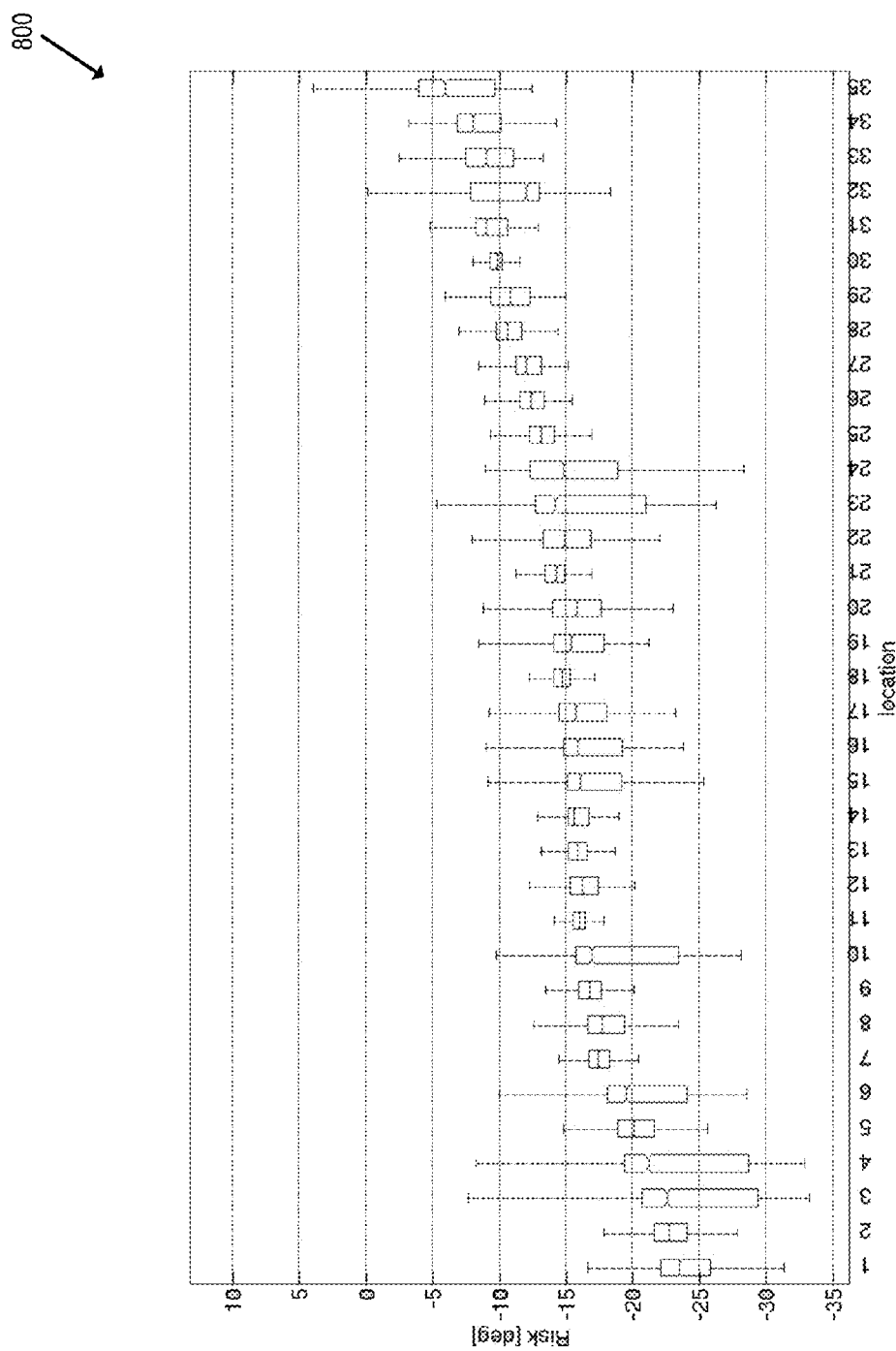
FIG. 8 shows a graph of box plots illustrating risk metric time series measured at a plurality of locations in the example data center.

A point-based risk metric could be, for example, risk(n, t)=$\Delta$T−reserve(n, t), where $\Delta$T is the difference between the current sensor value and the sensor threshold value at the location n at the time t, and where reserve(n, t) is the reserve metric at the location n at the time t. This metric has units of temperature. The risk of overheating at a selected location can be considered lower if the risk value is more negative, which is the result of more reserve and more distance from the selected temperature threshold. Very negative risk values are thus considered good in this definition and provide for a more natural ordering as shown in FIG. 8.

At step 608, the calculated reserve value and the risk value are provided to manage the environmental maintenance system. For example, in some embodiments, the risk value can be provided to allocate IT load, such as the locations of equipment and the amount of computational load placed on the equipment. The risk value can be converted into a risk score by grouping locations of similar risk profile together. It is sometimes difficult to define absolute risk thresholds to decide if a risk is unacceptable, or if the risk is so low that additional IT load can be deployed at that location. It may then be useful to group locations relative to each other. Specifically, one could consider only the 5 (or some other number) locations with the most negative risk value as relatively risk free, or one could use a percentile function to determine the tails of the risk distribution and so select unusually risky or risk-free locations and consider those for IT configuration changes.

These graphs can preferably also be used to decide where not to put new IT load, but use some other selection criteria to select among the remaining locations to new IT load.

It may be preferable for a risk averse operator to distribute the IT load and configure the cooling equipment in the data center in such a way that the risk profile is about the same at each monitored location so that there are no unusually good or unusually bad (with respect to risk or other metric) locations anymore.

Box plots acknowledge the fact that a data center is dynamic and that environmental variables change continuously. Since the boxes are summary representation of the underlying time series data, the boxes qualitatively do not change as fast or often as the time series data. It may therefore be advantageous for an operator to monitor such a box plot over longer period of time for qualitative changes and assess the change in risk through how the box plot characteristics changes. For example, the box plot may indicate at one time that a data center has many potential locations where new IT load could be placed. If the operator does not need to place new IT load, this information is not useful at first. However, if the number of suitable locations is shrinking over time, it could be an indication of some form of deterioration in the data center that warrants further investigation.

If there is a location that has been determined to be more suitable (by being less risky) for additional IT Load or IT equipment, it may be preferable to not change the level of IT load at that location, but to change what computational processes constitute the IT load at that location. Specifically, if given the option of running a mission critical computational process on one of two servers that are located at two different locations in the data center, a process scheduler may advantageously execute the process on the server that is located at the lower RISK location of the two.

In addition, a risk or reserve metric may be used in conjunction with emergency shutdown procedures to manage heat in the catastrophic absence of cooling. These procedures define, for example in what order and how quickly to shut down less essential software and hardware. Risk assessments (e.g., using a risk metric) can help develop these procedures, make them more relevant for the actual data center configuration (rather some assumed configuration), and extend the operational time of mission critical processes during emergency situations. These processes can redeveloped for different states of the system. For example, the optimal emergency shutdown sequence may be different if a particular CRAC is on or off when the emergency happens. Examples of emergencies may include power outages on the cooling equipment, or half of that equipment if each half is on different electric circuits.

It should be noted that although the risk and reserve metrics described with reference to FIG. 7 discuss the use of computer room air handlers (CRAHs) to cool a data center, such description is used for illustrative purposes, and not intended to be limiting. For example, in some embodiments of the invention, environmental maintenance modules may be primarily used to heat a space, such as a retail store during a cold winter. In such embodiments, the reserve value may measure an amount of heating reserve (i.e., remaining heating capacity of the environmental maintenance units). Similarly, the reserve value may measure an amount of heating risk, wherein the sensor threshold value determined at step 606 may be a minimum threshold temperature (e.g., beyond which customers in a store would be too cold).

A. Reserve Metric Calculation Methods

A reserve function often combines: (1) the current utilization of the environmental maintenance modules; (2) the limitations of the environmental maintenance modules; and (3) the influence the environmental maintenance modules on a sensor value at a location in an environmentally-controlled space. The first feature in the above list expresses actuals while the second and third features express predictions or what-if calculations. Embodiments of the invention can employ the mathematical 'influence' model determined in step 601 to correlate historic changes in equipment cooling to subsequent changes of monitored environmental variables in the data center. The specific reserve metric that is defined next is one example of such a combination of features.

In some embodiments, a reserve value at a selected location is defined as the largest achievable temperature drop at that location that could be caused by modifying operation levels of any or all actuators in an environmental maintenance system.

For example, assume an environmental maintenance module, k, is a Computer Room Air Handler (CRAH) with controllably variable fan speed. The sensors in the environmental maintenance system measure a temperature at various locations within the space. At step 601, an influence model was determined that expresses how changing this fan speed impacts the temperature at a selected location, n, in the environmentally-controlled space. In some embodiments, the predicted temperature change, dT(n, k), at that selected location, n, due to a change, dF(k), of the fan CRAH's fan speed can be expressed as dT(n, k)=I(n, k)*dF(k) where I(n, k) is an influence coefficient. Typically, dT(n, k) will have a negative slope, since an increase in fan speed dF(k) typically results in a decrease in temperature dT(n, k). However, it should be noted that other embodiments can use other models for determining dT(n, k).

The fan speed at a selected point in time, t, can be expressed as F(k, t). In some embodiments, the fan may have hard or configured limits Fmin(k) and Fmax(k). In such embodiments, the maximal temperature drop that this CRAH is expected to be able to effect on the selected location is:

$$dT(n,k,t)=I(n,k)*(Fmax(k)-F(k,t)) \text{ if } I<0, \text{ or}$$

$$dT(n,k,t)=I(n,k)*(-Fmin(k)-F(k,t)) \text{ if } I>0.$$

The first of these equations would be used if the CRAH had a cooling influence on the selected location when its fan speed is increased (which would typically be the case). The second of these equations would be used if the CRAH had a heating influence on the selected location when its fan speed is increased. The latter is known to happen in real data centers due to airflow patterns.

In some embodiments, the total temperature change, dT(n, t), that is deemed achievable by appropriate operation level changes to all actuators (e.g., fan speed) at the selected time, t, is calculated to be the total sum of the above calculated dT(n, k, t) from each environmental maintenance module, k. More formally, dT(n, t)=ΣdT(n, k, t).

In some embodiments, the reserve metric can be expressed as reserve(n, t)=−dT(n, t). A large (in absolute terms) reserve implies that the combined environmental maintenance modules have the potential to be highly influential on the selected location. Combining all of the above expressions, the reserve metric can also be expressed as:

$$\text{reserve}(n, t) = -\sum_{k=0}^{K} I(n, k) \times dT(n, k, t)$$

Where I(n, k) is the value of the influence model for an environmental maintenance module k at the location n, and wherein dF(n, k, t) is a difference between an operation threshold value and a current operation level for an actuator associated with the environmental maintenance module k.

Clearly, if each environmental maintenance module was already at its respective limit for the selected location, the reserve is zero, which means that any change to operation levels is predicted to increase the temperature at that location.

This reserve metric is point-based since it takes into account the impact of operation level change at one selected location (or point in space) at a time. However, maximizing the cooling impact on one location could have a detrimental impact on another location. In some embodiments, a reserve metric can determine as the reserve the maximal achievable temperature change at a selected location that does not also raise the temperature at another location above a selected threshold. Such a reserve metric will be generally smaller than the metric presented above.

A further improvement to the reserve metric takes into account the possibility that one, two, or more of the environmental maintenance modules in the data center could fail at any time. The reserve metric could be reduced to the value that is the smallest reserve under all selected failure scenarios. This could be called a worst-case reserve metric. It may then also be useful to record for each location the one, two, or more environmental maintenance modules whose potential failures are the cause of the worst-case reserve metric value at that location. Then, if a module is associated with the worst-case reserve of many locations one could deduce that that piece of equipment is mission-critical and potentially in need of redundant backup.

As an example of the value of the worst-case reserve metric improvement, consider the case where several CRAHs provide cooling to a selected location. Assume that all have a cooling influence on that location but all but one are maxed out. For simplicity, assume that the remaining CRAH is currently not providing any cooling. The reserve at that location is therefore good because this remaining CRAH could increase its cooling output if necessary. However, the worst-case reserve metric would be zero because after a failure of this CRAH there is no additional cooling source left. Failure of another CRAH could be balanced by said remaining CRAH but that also leaves no reserve. Finally, the worst-case reserve in this case could even be negative if said remaining CRAH has less absolute influence on the selected location than one of the other CRAHs.

Despite being point-based, the reserve metric implicitly captures some aspects of the other locations by referring to the current operation levels of environmental maintenance modules. Specifically, if other locations are particularly hot, or if heating load is generally high compared to the total design cooling capacity of the environmental maintenance modules, the environmental maintenance modules should be already running closer to their respective limits thus reducing the available reserve at a location, even if that location would be considered cool judging by its temperature alone.

B. Reserve Box Plot

FIG. 7 shows a graph 700 of box plots illustrating the reserve time series corresponding to the data shown in graphs 400 and 500. The location labels on the horizontal axis are the same as in the previous examples.

In this example, some locations exhibit large variations in reserve and occasionally had no reserve at all in the past. When there was no reserve, an IT load spike could have increased temperatures without the cooling equipment having the ability to suppress the resulting temperature spike. However, if the expected spike had been comparably small, the spike may not have been enough to raise the temperature above an alarming threshold or other threshold. So despite being, in a sense, uncontrollable when there is no cooling reserve, at a selected location there may be little risk to the data center if that location happens to be quite cool at that time anyway.

C. Risk Box Plot

FIG. 8 shows a graph 800 of box plots illustrating risk metric time series measured at a plurality of locations in the example data center. The boxes are sorted from left to right by increasing value of the upper box edge to express increasing risk.

In this example data center the DeltaT box plot (graph 500) and the risk box plot (graph 800) correlate so that high temperatures mostly also imply more risk. There are, however, non-obvious surprises. For example, location 22 had high temperatures (graph 500) compared to most other locations in the data center but it also had unusually high reserves, so that it ends up with about medium risk. Depending on data center configurations one can easily expect to find high-risk points that have been historically cool while lacking good reserves. One should avoid directing IT load to such a location.

It can be useful to visualize risk by superimposing a value-colored map of location-interpolated risk values onto a floor plan of the data center in order to more easily find clusters of risky or less risky locations.

IV. Virtual Machine Allocation Methods

In some embodiments, it may be preferable to communicate reserve and risk values or a selection of least risky locations to a virtualization or virtual machine manager so that that virtual machine manager can move mission-critical IT load or computational processes preferably to those locations.

Figure 9:
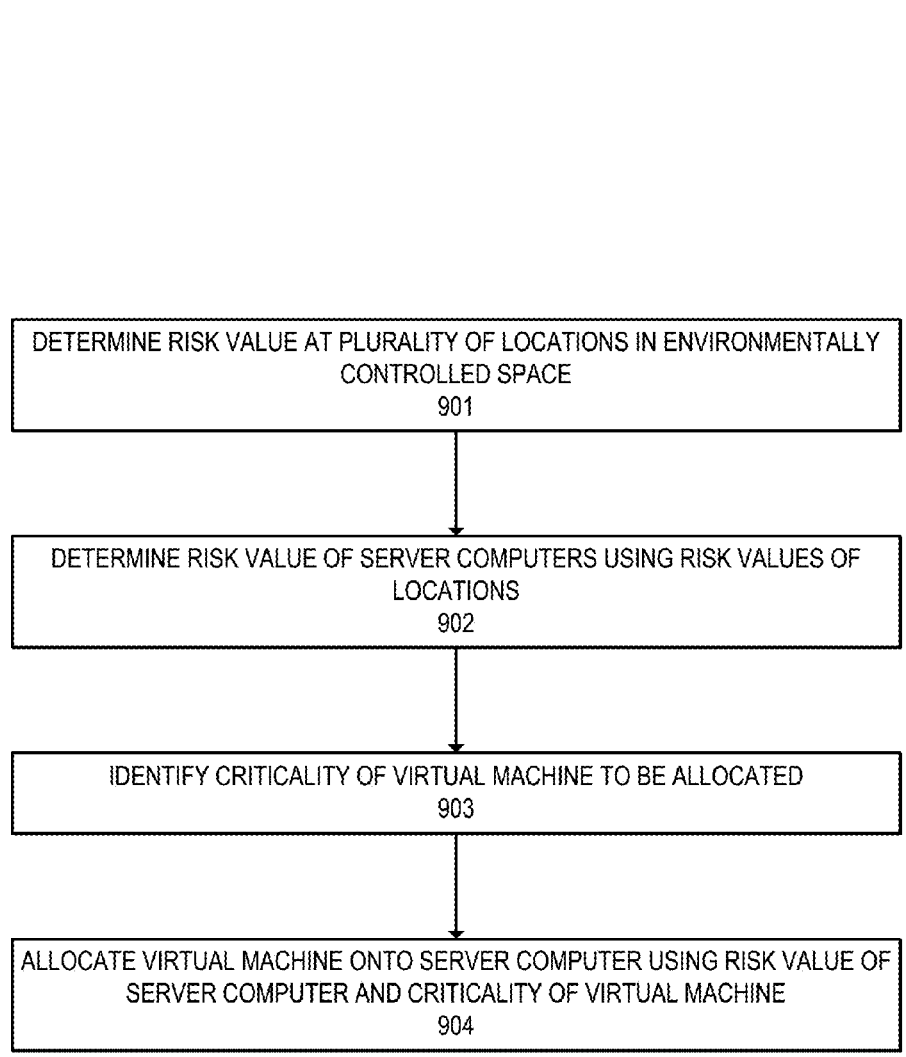
FIG. 9 shows a method for allocating virtual machines to server computers using risk scores according to embodiments of the invention.

FIG. 9 shows a method 900 for allocating virtual machines to server computers using risk values. Allocating a virtual machine may happen periodically (e.g., at regular intervals), upon an event (e.g., when the virtual machine is started), or at another time. In some embodiments, method 900 may be performed by a virtual machine manager.

At step 901, the risk values at one or more locations in a data center are determined. The risk scores may be determined using any suitable method, such as method 600 as shown in FIG. 6.

At step 902, a risk value of one or more server computers is determined using the risk values of the one or more locations. In some embodiments, risk values for servers may be determined using an average of the risk values of locations near the server computer, wherein the average is weighted in proportion to the proximity of the risk values.

At step 903, a criticality of the virtual machine is determined. The criticality of the virtual machine may indicate how essential the task performed by the virtual machine is. For example, a virtual machine running a production web server or database may be highly critical, whereas a virtual machine performing a routine backup operation may be less critical.

At step 904, the virtual machine is allocated onto a server computer based on the risk values determined at step 902 and the criticality of the virtual machine determined at step 903. For example, in some embodiments, a virtual machine manager could use the risk value, and the associated metrics that it is composed of, to determine which storage device and which cores (servers) among several should be used to run a virtual machine. High-priority VMs could be run on cores and storage arrays that have large reserve. This is related to, but not exactly the same as, deciding where to add IT load. Rather the question is more one of IT Load distribution to produce the lowest computational application risk to the data center operator.

Adding or subtracting IT Load can change the configuration in a way that makes the model predictions initially less reliable after the configuration change, especially if hardware changes are involved (such as adding a server to an available server rack slot). However, moving computational processes around without changing the IT load much locally has benefits to the consumer of these processes (better guarantee of high availability) but also benefits to the data center operator (fewer actual configuration changes that make model-based predictions less reliable, at least until the model is updated to reflect the configuration changes).

V. Computer System

Figure 10:
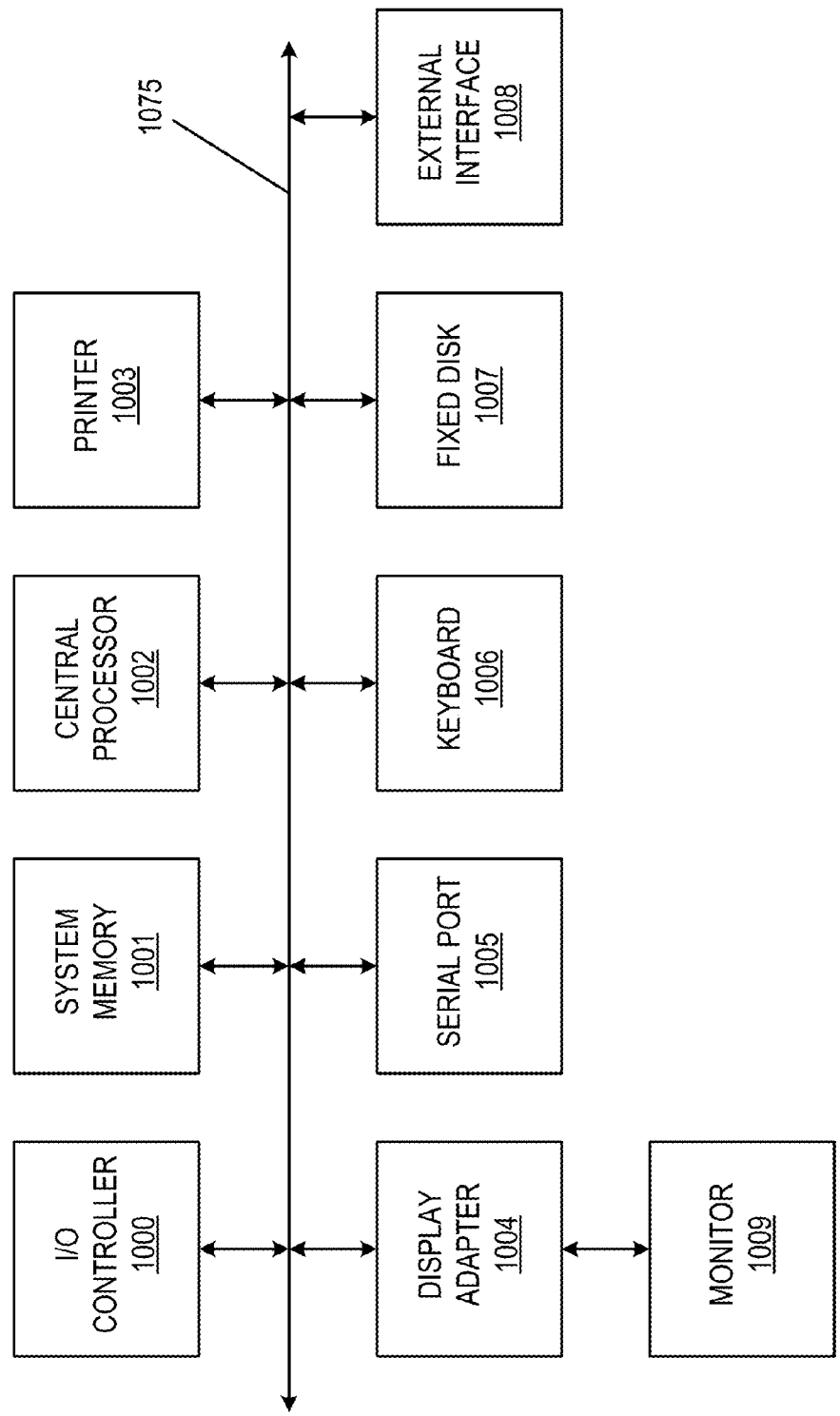
FIG. 10 shows a block diagram of an exemplary computer system according to some embodiments of the invention.

FIG. 10 is a high level block diagram of a computer system that may be used to implement any of the entities or components described above. The subsystems shown in FIG. 10 are interconnected via a system bus 1075. Additional subsystems include a printer 1003, keyboard 1006, fixed disk 1007, and monitor 1009, which is coupled to display adapter 1004. Peripherals and input/output (I/O) devices, which couple to I/O controller 1000, can be connected to the computer system by any number of means known in the art, such as a serial port. For example, serial port 1005 or external interface 1005 can be used to connect the computer apparatus to a wide area network such as the Internet, a mouse input device, or a scanner. The interconnection via system bus 1075 allows the central processor 1002 to communicate with each subsystem and to control the execution of instructions from system memory 1001 or the fixed disk 1007, as well as the exchange of information between subsystems. The system memory 1001 and/or the fixed disk may embody a computer-readable medium.

Storage media and computer-readable media for containing code, or portions of code, can include any appropriate media known or used in the art, including storage media and communication media, such as but not limited to volatile and non-volatile, removable and non-removable media implemented in any method or technology for storage and/or transmission of information such as computer-readable instructions, data structures, program modules, or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices, data signals, data transmissions, or any other medium which can be used to store or transmit the desired information and which can be accessed by the computer. Based on the disclosure and teachings provided herein, a person of ordinary skill in the art will appreciate other ways and/or methods to implement the various embodiments.

The above description is illustrative and is not restrictive. Many variations of the invention may become apparent to those skilled in the art upon review of the disclosure. The scope of the invention may, therefore, be determined not with reference to the above description, but instead may be determined with reference to the pending claims along with their full scope or equivalents.

It may be understood that the present invention as described above can be implemented in the form of control logic using computer software in a modular or integrated manner. Based on the disclosure and teachings provided herein, a person of ordinary skill in the art may know and appreciate other ways and/or methods to implement the present invention using hardware and a combination of hardware and software.

Any of the software components or functions described in this application, may be implemented as software code to be executed by a processor using any suitable computer language such as, for example, Java, C++ or Perl using, for example, conventional or object-oriented techniques. The software code may be stored as a series of instructions, or commands on a computer readable medium, such as a random access memory (RAM), a read only memory (ROM), a magnetic medium such as a hard-drive or a floppy disk, or an optical medium such as a CD-ROM. Any such computer readable medium may reside on or within a single computational apparatus, and may be present on or within different computational apparatuses within a system or network.

One or more features from any embodiment may be combined with one or more features of any other embodiment without departing from the scope of the invention.

A recitation of "a", "an" or "the" is intended to mean "one or more" unless specifically indicated to the contrary.

What is claimed is:

1. A computer-implemented method of using an environmental maintenance system that includes a plurality of actuators and a plurality of sensors in an environmentally-controlled space, each sensor measuring a value of a physical condition at a respective location, the method comprising:
   obtaining, by a computer system, an influence model for an actuator of an environmental maintenance module, wherein the influence model provides a change in a sensor value at a respective location for a corresponding change in an operation level of the actuator, wherein the operation level quantifies a functioning property of the actuator;
   for each of one or more of the locations:
   for each of one or more times:
   detecting, by the computer system, a current operation level for each of the actuators;
   identifying, by the computer system, an operation threshold value for each of the actuators; and
   calculating, by the computer system, a reserve value at the location using a reserve metric that includes the influence model, the current operation levels, and the operation threshold values, wherein an operation threshold value is a maximum achievable value for the functioning property of the actuator, wherein the reserve value indicates a maximum achievable change in the sensor value at the location, wherein the reserve metric is time-dependent; and
   managing the environmental maintenance system or loads in the environmentally-controlled space based on the one or more reserve values, wherein the managing includes:
   allocating a computational load to one or more server computers in the environmentally-controlled space based on the one or more reserve values by sending a first command to a first server computer to assign a first computational load to the first server computer based on the one or more reserve values.

2. The method of claim 1, wherein the reserve value is defined for a location n at a time t using the formula:

$$\text{reserve}(n, t) = -\sum_{k=0}^{K} I(n, k) \times dF(n, k, t)$$

wherein I(n, k) is the value of the influence model for an environmental maintenance module k at the location n, and wherein dF(n, k, t) is a difference between the operation threshold value and the current operation level for an actuator associated with the environmental maintenance module k.

3. The method of claim 1, wherein the reserve value indicates the maximum achievable change without causing a sensor value at a different location in the environmentally-controlled space to exceed a threshold.

4. The method of claim 1, wherein the maximum achievable change is the smallest maximum achievable if any one environmental maintenance module in the environmentally-controlled space fails.

5. The method of claim 1, further comprising:
   for each of the one or more locations:
   for each of the one or more times:
   detecting, by the computer system, a current sensor value for a sensor measuring the location;
   identifying, by the computer system, a sensor threshold value for the sensor; and
   calculating, by the computer system, a risk value at the location using a risk metric that includes the calculated reserve value, the current sensor value, and the sensor threshold value, wherein the risk value indicates a risk of exceeding the sensor threshold value; and
   providing, by the computer system, the one or more risk values for managing the environmental maintenance system or loads in the environmentally-controlled space.

6. The method of claim 5, wherein the risk value is defined for a location n at a time t using the formula $$\text{risk}(n,t) = \Delta T - \text{reserve}(n,t)$$

wherein $\Delta T$ is the difference between the current sensor value and the sensor threshold value at the location n at the time t, and wherein reserve(n, t) is the reserve value at the location n at the time t.

7. The method of claim 5, wherein managing loads in the environmentally-controlled space comprises determining a location of a new server computer in the environmentally-controlled space so that the risk value is minimized.

8. The method of claim 5, wherein managing loads in the environmentally-controlled space comprises allocating computational work to one or more server computers in the environmentally-controlled space so that the risk value is minimized.

9. The method of claim 5, wherein managing loads in the environmentally-controlled space comprises distributing the loads so that the risk value at each of the one or more locations is approximately equal.

10. The method of claim 5, wherein managing loads in the environmentally-controlled space includes allocating a virtual machine to one of a plurality of server computers in the environmentally-controlled space, the method comprising:
    determining a risk value at each of a plurality of locations in the environment, wherein each risk value indicates a risk of exceeding a sensor threshold value at a location;
    determining a risk value of each of the plurality of server computers in the environmentally-controlled space; and
    allocating the virtual machine onto one of the plurality of server computers based on the risk values for the plurality of server computers.

11. The method of claim 1, wherein the influence model indicates a relationship between a fan speed of an environmental maintenance module at a location and a temperature at the location, wherein the current operation levels of the actuators are current fan speeds, wherein the operation threshold values are maximum fan speeds, and wherein the maximum achievable change in the sensor value is a maximum achievable temperature decrease.

12. The computer-implemented method of claim 1, wherein the maximum achievable change in the sensor value is a maximum achievable temperature change.

13. A computer product comprising a non-transitory computer readable medium storing a plurality of instructions for controlling a computer system to perform an operation for an environmental maintenance system that includes a plurality of actuators and a plurality of sensors in an environmentally-controlled space, each sensor measuring a value of a physical condition at a respective location, the operation comprising:

obtaining an influence model for an actuator of an environmental maintenance module, wherein the influence model provides a change in a sensor value at a respective location for a corresponding change in an operation level of the actuator, wherein the operation level quantifies a functioning property of the actuator;

for each of one or more of the locations:
  for each of one or more times:
    detecting a current operation level for each of the actuators;
    identifying an operation threshold value for each of the actuators; and
    calculating a reserve value at the location using a reserve metric that includes the influence model, the current operation levels, and the operation threshold values, wherein an operation threshold value is a maximum achievable value for the functioning property of the actuator, wherein the reserve value indicates a maximum achievable change in the sensor value at the location, wherein the reserve metric is time-dependent; and managing the environmental maintenance system or loads in the environmentally-controlled space based on the one or more reserve values, wherein the managing includes:
  allocating a computational load to one or more server computers in the environmentally-controlled space based on the one or more reserve values by sending a first command to a first server computer to assign a first computational load to the first server computer based on the one or more reserve values.

14. The computer product of claim 13, wherein the reserve value is defined for a location n at a time t using the formula:

$$\text{reserve}(n, t) = -\sum_{k=0}^{K} I(n, k) \times dF(n, k, t)$$

wherein l(n, k) is the value of the influence model for an environmental maintenance module k at the location n, and wherein dF(n, k, t) is a difference between the operation threshold value and the current operation level for an actuator associated with the environmental maintenance module k.

15. The computer product of claim 13, the operation further comprising:
for each of the one or more locations:
  for each of the one or more times:
    detecting a current sensor value for a sensor measuring the location;
    identifying a sensor threshold value for the sensor; and
    calculating a risk value at the location using a risk metric that includes the calculated reserve value, the current sensor value, and the sensor threshold value, wherein the risk value indicates a risk of exceeding the sensor threshold value; and
  providing the one or more risk values for managing the environmental maintenance system or loads in the environmentally-controlled space.

16. The computer product of claim 15, wherein managing loads in the environmentally-controlled space includes allocating a virtual machine to one of a plurality of server computers in the environmentally-controlled space, the operation further comprising:
  determining a risk value at each of a plurality of locations in the environment, wherein each risk value indicates a risk of exceeding a sensor threshold value at a location;
  determining a risk value of each of the plurality of server computers in the environmentally-controlled space; and
  allocating the virtual machine onto one of the plurality of server computers based on the risk values for the plurality of server computers.

17. The computer product of claim 13, wherein the influence model indicates a relationship between a fan speed of an environmental maintenance module at a location and a temperature at the location, wherein the current operation levels of the actuators are current fan speeds, wherein the operation threshold values are maximum fan speeds, and wherein the maximum achievable change in the sensor value is a maximum achievable temperature decrease.

18. An environmental maintenance system comprising:
a plurality of actuators;
a plurality of sensors, each sensor measuring a value of a physical condition at a respective location; and
one or more processors configured to:
  obtaining an influence model for an actuator of an environmental maintenance module, wherein the influence model provides a change in a sensor value at a respective location for a corresponding change in an operation level of the actuator, wherein the operation level quantifies a functioning property of the actuator;
  for each of one or more of the locations:
    for each of one or more times:
      detecting a current operation level for each of the actuators;
      identifying an operation threshold value for each of the actuators; and
      calculating a reserve value at the location using a reserve metric that includes the influence model, the current operation levels, and the operation threshold values, wherein an operation threshold value is a maximum achievable value for the functioning property of the actuator, wherein the reserve value indicates a maximum achievable change in the sensor value at the location, wherein the reserve metric is time-dependent; and
  managing the environmental maintenance system or loads in the environmentally-controlled space based on the one or more reserve values, wherein the managing includes:
    allocating a computational load to one or more server computers in the environmentally-controlled space based on the one or more reserve values by sending a first command to a first server computer to assign a first computational load to the first server computer based on the one or more reserve values.

19. The environmental maintenance system of claim 18, wherein the reserve value is defined for a location n at a time t using the formula:

$$\text{reserve}(n, t) = -\sum_{k=0}^{K} I(n, k) \times dF(n, k, t)$$

wherein l(n, k) is the value of the influence model for an environmental maintenance module k at the location n, and wherein dF(n, k, t) is a difference between the operation threshold value and the current operation level for an actuator associated with the environmental maintenance module k.

20. The environmental maintenance system of claim 18, the operation further comprising:
for each of the one or more locations:
for each of the one or more times:
detecting a current sensor value for a sensor measuring the location;
identifying a sensor threshold value for the sensor; and
calculating a risk value at the location using a risk metric that includes the calculated reserve value, the current sensor value, and the sensor threshold value, wherein the risk value indicates a risk of exceeding the sensor threshold value; and
providing the one or more risk values for managing the environmental maintenance system or loads in the environmentally-controlled space.

21. The environmental maintenance system of claim 20, wherein managing loads in the environmentally-controlled space includes allocating a virtual machine to one of a plurality of server computers in the environmentally-controlled space, the operation further comprising:
determining a risk value at each of a plurality of locations in the environment, wherein each risk value indicates a risk of exceeding a sensor threshold value at a location;
determining a risk value of each of the plurality of server computers in the environmentally-controlled space; and
allocating the virtual machine onto one of the plurality of server computers based on the risk values for the plurality of server computers.

* * * * *